(12) United States Patent
Chung

(10) Patent No.: US 8,988,965 B2
(45) Date of Patent: Mar. 24, 2015

(54) LOW-PIN-COUNT NON-VOLATILE MEMORY INTERFACE

(76) Inventor: Shine C. Chung, San Jose, CA (US)

( * ) Notice: Subject to any disclaimer, the term of this patent is extended or adjusted under 35 U.S.C. 154(b) by 593 days.

(21) Appl. No.: 13/288,843

(22) Filed: Nov. 3, 2011

(65) Prior Publication Data

US 2012/0106231 A1    May 3, 2012

Related U.S. Application Data

(60) Provisional application No. 61/409,539, filed on Nov. 3, 2010.

(51) Int. Cl.
*G11C 17/18* (2006.01)

(52) U.S. Cl.
USPC ........... 365/225.7; 365/96; 365/148; 365/158

(58) Field of Classification Search
CPC ........ G11C 18/00; G11C 16/10; G11C 16/26; G11C 29/12; G11C 8/18
USPC .......... 365/90, 96, 100, 148, 163, 225.7, 154, 365/171–173; 257/2–5, 592
See application file for complete search history.

(56) References Cited

U.S. PATENT DOCUMENTS

| | | |
|---|---|---|
| 3,198,670 A | 8/1965 | Nissim |
| 3,715,242 A | 2/1973 | Daniel |
| 4,148,046 A | 4/1979 | Hendrickson et al. |
| 4,192,059 A | 3/1980 | Khan et al. |
| 5,192,989 A | 3/1993 | Matsushita et al. |
| 5,389,552 A | 2/1995 | Iranmanesh |
| 5,635,742 A | 6/1997 | Hoshi et al. |
| 5,637,901 A | 6/1997 | Beigel et al. |
| 5,723,890 A | 3/1998 | Fujihira et al. |
| 5,757,046 A | 5/1998 | Fujihira et al. |
| 5,962,903 A | 10/1999 | Sung et al. |
| 6,008,092 A | 12/1999 | Gould |
| 6,140,687 A | 10/2000 | Shimormura et al. |
| 6,243,864 B1 | 6/2001 | Odani et al. |
| 6,400,540 B1 | 6/2002 | Chang |

(Continued)

FOREIGN PATENT DOCUMENTS

| | | |
|---|---|---|
| CN | 1469473 A | 1/2004 |
| CN | 1691204 A | 11/2005 |

(Continued)

OTHER PUBLICATIONS

U.S. Appl. No. 13/471,704, filed May 15, 2012.

(Continued)

*Primary Examiner* — Hien Nguyen

(57) ABSTRACT

A low-pin-count non-volatile (NVM) memory to be provided in an integrated circuit. In one embodiment, the low-pin-count non-volatile (NVM) memory can use only one external control signal and one internal clock signal to generate start, stop, device ID, read/program/erase pattern, starting address, and actual read/program/erase cycles. When programming or erasing begins, toggling of the control signal increments/decrements a program or erase address and a pulse width of the control signal determines the actual program or erase time. A data out of the low-pin-count non-volatile (NVM) memory can be multiplexed with the control signal. Since the clock signal can be derived and shared from the system clock of the integrated circuit, the NVM memory need only have one external control pin for I/O transactions to realize a low-pin-count interface.

27 Claims, 14 Drawing Sheets

(56) References Cited

U.S. PATENT DOCUMENTS

| | | |
|---|---|---|
| 6,405,160 B1 | 6/2002 | Djaja et al. |
| 6,461,934 B2 | 10/2002 | Nishida et al. |
| 6,483,734 B1 | 11/2002 | Sharma et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,803,804 B2 | 10/2004 | Madurawe |
| 6,813,705 B2 | 11/2004 | Duesterwald et al. |
| 6,944,083 B2 | 9/2005 | Pedlow |
| 6,967,879 B2 | 11/2005 | Mizukoshi |
| 7,211,843 B2 | 5/2007 | Low et al. |
| 7,212,432 B2 | 5/2007 | Ferrant et |
| 7,263,027 B2 | 8/2007 | Kim et al. |
| 7,294,542 B2 | 11/2007 | Okushima |
| 7,391,064 B1 | 6/2008 | Tripsas et al. |
| 7,411,844 B2 | 8/2008 | Nitzan et al. |
| 7,439,608 B2 | 10/2008 | Arendt |
| 7,461,371 B2 | 12/2008 | Luo et al. |
| 7,573,762 B2 | 8/2009 | Kenkare et al. |
| 7,589,367 B2 * | 9/2009 | Oh et al. ............ 257/296 |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,802,057 B2 | 9/2010 | Iyer et al. |
| 7,808,815 B2 * | 10/2010 | Ro et al. ............ 365/163 |
| 7,833,823 B2 | 11/2010 | Klersy |
| 7,889,204 B2 | 2/2011 | Hansen et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,174,063 B2 | 5/2012 | Liu et al. |
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Yamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung et al. |
| 8,482,972 B2 | 7/2013 | Chung |
| 8,488,359 B2 | 7/2013 | Chung |
| 8,488,364 B2 | 7/2013 | Chung |
| 8,514,606 B2 | 8/2013 | Chung |
| 8,570,800 B2 | 10/2013 | Chung |
| 8,817,563 B2 | 8/2014 | Chung |
| 8,830,720 B2 | 9/2014 | Chung |
| 8,854,859 B2 | 10/2014 | Chung |
| 8,861,249 B2 | 10/2014 | Chung |
| 2002/0196659 A1 | 12/2002 | Hurst et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2005/0060500 A1 | 3/2005 | Luo et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansai et al. |
| 2006/0215440 A1 | 9/2006 | Cho et al. |
| 2006/0244099 A1 | 11/2006 | Kurjanowicz |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0279978 A1 | 12/2007 | Ho et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0151612 A1 | 6/2008 | Pellizzer et al. |
| 2008/0220560 A1 | 9/2008 | Klersy |
| 2008/0225567 A1 | 9/2008 | Burr et al. |
| 2008/0280401 A1 | 11/2008 | Burr et al. |
| 2009/0055617 A1 | 2/2009 | Bansai et al. |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0309089 A1 | 12/2009 | Hsia et al. |
| 2010/0027326 A1 | 2/2010 | Kim et al. |
| 2010/0091546 A1 | 4/2010 | Liu et al. |
| 2010/0142254 A1 | 6/2010 | Choi et al. |
| 2010/0171086 A1 | 7/2010 | Lung et al. |
| 2010/0232203 A1 | 9/2010 | Chung et al. |
| 2010/0277967 A1 | 11/2010 | Lee et al. |
| 2010/0301304 A1 | 12/2010 | Chen et al. |
| 2011/0128772 A1 | 6/2011 | Kim et al. |
| 2011/0145777 A1 | 6/2011 | Iyer et al. |
| 2011/0260289 A1 | 10/2011 | Oyamada |
| 2011/0297912 A1 | 12/2011 | Samachisa et al. |
| 2011/0312166 A1 | 12/2011 | Yedinak et al. |
| 2012/0032303 A1 | 2/2012 | Elkareh et al. |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0215663 A1 | 8/2013 | Chung |
| 2013/0235644 A1 | 9/2013 | Chung |
| 2014/0071726 A1 | 3/2014 | Chung |
| 2014/0124871 A1 | 5/2014 | Ko et al. |
| 2014/0124895 A1 | 5/2014 | Salzman et al. |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0211567 A1 | 7/2014 | Chung |
| 2014/0269135 A1 | 9/2014 | Chung |

FOREIGN PATENT DOCUMENTS

| | | |
|---|---|---|
| CN | 101083227 A | 5/2007 |
| CN | 101057330 A | 10/2007 |
| CN | 101188140 A | 5/2008 |
| CN | 101271881 A | 9/2008 |
| CN | 101483062 A | 7/2009 |

(56) References Cited

FOREIGN PATENT DOCUMENTS

| CN | 101728412 A | 6/2010 |
|---|---|---|
| EP | 1367596 A1 | 12/2003 |
| JP | 2-62630 | 3/1990 |
| TW | I309081 | 4/2009 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/590,044, filed Aug. 20. 2012.
U.S. Appl. No. 13/590,047, filed Aug. 20. 2012.
U.S. Appl. No. 13/590,049, filed Aug. 20. 2012.
U.S. Appl. No. 13/590,050, filed Aug. 20. 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics,"Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. On Elec. Dev., vol. 41, No. 2, Feb. 1994, pp. 204-211.
Banerjee, Kaustav et al., "High Current Effects in Silicide Films for Sub-0.25um VLSI Technologies," IEEE 36th IRPS, 1998, pp. 284-292.
Bedeschi, F. et al., "4-Mb MOSFET—Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. On Circuits and Systems, (ISCAS), vol. 2, 2004, pp. 628-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "SET and RESET Pulse Characterization in BJT-Selected Phase-Change Memory," IEEE Int. Symp. On Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512×8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS—Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.

(56) References Cited

OTHER PUBLICATIONS

Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.
Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tec. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology,"7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. on ASIC (ASICON), 2009. pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi2 Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawhara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.

Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol., 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.
Lee, H.Y. et al., "Low Power and High Speed Bipolar Switching with A Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid- Stat Cir. (EDSSC), Dec. 2009, pp. 457-460.

(56) References Cited

OTHER PUBLICATIONS

Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. On Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. On Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. ½ Jan./Mar. 2007, pp. 65-75.
Robson, Norm et al., "Electrically Programmable Fuse (eFuse) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2—Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.

(56) References Cited

OTHER PUBLICATIONS

Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo. cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.

(56) References Cited

OTHER PUBLICATIONS

"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Notice of Allowance for U.S. Appl. No. 13/590,044, mailed Apr. 29, 2014.
Notice of Allowance for U.S. Appl. No. 13/954,831, mailed May 27, 2014.
Notice of Allowance of U.S. Appl. No. 13/833,044, mailed May 29, 2014.
Notice of Allowance for U.S. Appl. No. 13/761,048, mailed Jun. 10, 2014.
Office Action for Taiwanese Patent Application No. 100129642, mailed May 19, 2014 (with translation).
Office Action for U.S. Appl. No. 13/072,783, mailed Nov. 7, 2013.
Notice of Allowance for U.S. Appl. No. 13/026,840, mailed Jun. 24, 2014.
Notice of Allowance for U.S. Appl. No. 13/214,198, mailed Jun. 23, 2014.
Notice of Allowance for U.S. Appl. No. 13/590,044, mailed Jun. 23, 2014.
Ker et al., "MOS-bounded diodes for on-chip ESD protection in a 0.15- μm shallow-trench-isolation salicided CMOS Process" International Symposium on VLSI Technology, Systems and Applications, 2003, 5 pgs.
Notice of Allowance for U.S. Appl. No. 13/840,965, mailed Jun. 25, 2014.
Office Action for U.S. Appl. No. 13/970,562, mailed Jun. 27, 2014.
Office Action for U.S. Appl. No. 13/835,308, mailed Jun. 27, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Restriction Requirement for U.S. Appl. No. 13/678,544, mailed Aug. 1, 2014.
Notice of Allowance for U.S. Appl. No. 13/761,097, mailed Jul. 25, 2014.
Ex parte Quayle for U.S. Appl. No. 13/761,057, mailed Aug. 8, 2014.
Final Office Action for U.S. Appl. No. 13/314,444, mailed May 14, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/761,057, mailed Sep. 26, 2014.
Notice of Allowance for U.S. Appl. No. 13/833,044, mailed Sep. 24, 2014.
Notice of Allowance for U.S. Appl. No. 13/314,444, mailed Sep. 24, 2014.
Office Action for U.S. Appl. No. 13/761,045, mailed Sep. 30, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.

\* cited by examiner

LOW-PIN-COUNT NON-VOLATILE MEMORY INTERFACE

CROSS-REFERENCE TO RELATED APPLICATION

This application claims priority benefit of U.S. Provisional Patent Application No. 61/409,539, filed on Nov. 3, 2010 and entitled "Circuit and System of A Low Pin Count One-Time-Programmable Memory," which is hereby incorporated herein by reference.

BACKGROUND OF THE INVENTION

Non-volatile memory (NVM) is able to retain data when the power supply of a memory is cut off. The memory can be used to store data such as parameters, configuration settings, long-term data storage, etc. Similarly, this kind of memory can be used to store instructions, or codes, for microprocessors, DSPs, or microcontrollers (MCU), etc. Non-volatile has three operations, read, write (or called program), and erase, for reading data, programming data, and erasing data before re-programming. Non-volatile memory can be a flash memory that can be programmed from 10K to 100K times, or Multiple-Time Programmable (MTP) that can be programmed from a few times to a few hundred times.

One-Time-Programmable (OTP) is a particular type of non-volatile memory that can be programmed only once. An OTP memory allows the memory cells being programmed once and only once in their lifetime. OTP is generally based on standard CMOS process and usually embedded into an integrated circuit that allows each die in a wafer to be customized. There are many applications for OTP, such as memory repair, device trimming, configuration parameters, chip ID, security key, feature select, and PROM, etc.

FIG. 1 shows a conventional OTP cell. The OTP cell 10 has an OTP element 11 and a program selector 12. The OTP element is coupled to a supply voltage V+ in one end and a program selector 12 at the other. The program selector 12 has the other end coupled to a second supply voltage V−. The program selector 12 can be turned on by asserting a control terminal Sel. The program selector 12 is usually constructed from a MOS device. The OTP element 11 is usually an electrical fuse based on polysilicon or silicided polysilicon, a floating gate to store charges, or an anti-fuse based on gate oxide breakdown, etc.

FIG. 2 shows a pin configuration of a conventional serial OTP memory 20. The OTP memory 20 has an OTP memory module 22 and a power-switch device 21 that couples to a high voltage supply VDDP and the OTP memory module 22. The OTP memory 22 has a chip enable, program, clock, power-switch select, and an output signal denoted as CS#, PGM, CLK, PSWS, and Q, respectively. CS# selects the OTP memory 22 for either read or program. PGM is for program or read control. CLK is for clocking the memory 22. PSWS is for turning on an optional device, power-switch device 21. The output signal Q is for outputting data. Since there are several I/O pins, the footprint of an OTP memory to be integrated into an integrated circuit the cost is relatively high.

FIG. 3(a) shows a program timing waveform of a serial OTP memory with the I/O pin configurations as shown in FIG. 2. If the CLK is low and PGM is high when the CS# falls, the OTP goes into a program mode. Then, PGM toggles to high before the rising edges of CLK for those bits to be programmed. The high CLK period is the actual program time. Similarly, FIG. 3(b) shows a read timing waveform of a serial OTP memory with the I/O pin configurations shown in FIG. 2. If the CLK is high and PGM is low when CS# falls, the OTP goes into a read mode. The cell data are read out at the falling edges of CLK one by one. These timing waveforms in FIGS. 3(a) and 3(b) are relatively complicated.

Another similar low-pin-count I/O interface is the Serial Peripheral Interconnect (SPI) that has CSB, SCLK, SIN, and SO pins for chip select, serial clock, serial input, and serial output, respectively. The timing waveform of SPI is similar to that in FIGS. 3(a) and 3(b). Another two-pin serial I/O interface is $I^2C$ that has only two pins: SDA and SCL, for serial data and serial clock, respectively. This I/O interface is for an SRAM-like devices that have comparable read and write access time. The $I^2C$ for programming a byte or a page in a serial EEPROM is quite complicated: upon issuing a start bit, device ID, program bit, start address, and stop bit, the chip goes into hibernation so that an internally generated programming is performed for about 4 ms. A status register can be checked for completion before next program command can be issued again. In an OTP, the program time is several orders of magnitude higher than the read access and much lower than either the program or erase time of EEPROM, for example 1 us versus 50 ns for read and 1 us versus 4 ms for program/erase, such that $I^2C$ interface for OTP is not desirable because of high timing overhead.

As OTP memory sizes continue to be reduced, the number of external interface pins becomes a limitation to the OTP memory size. The current serial interfaces have about 2-4 pins and are not able to effectively accommodate read and program speed discrepancies. Accordingly, there is a need for a low-pin-count interface for non-volatile memory, such as OTP memory.

SUMMARY OF THE INVENTION

The invention relates to a low-pin-count non-volatile memory (NVM) having reduced area and footprint. In one embodiment, the low-pin-count non-volatile memory can use an interface that makes use of only one pin external to an integrated circuit. This interface not only can use only one external pin but also can share several internal pins with the rest of integrated circuit to thereby reduce area and footprint. Moreover, if desired, the one external pin can be further multiplexed with the other pins so that no additional pins are needed. In one embodiment the interface can pertain to a low-pin-count OTP interface for an OTP memory so that the OTP memory can be easily integrated into an integrated circuit.

In one embodiment, a non-volatile memory interface can uses only two signals, PGM and CLK for program control and clock, respectively. By comparing the relative phase between these two signals, the start and stop conditions can be detected. In addition, device ID, read/program/erase mode, and starting address can be determined. Thereafter, read, program, or erase sequences can be signaled. Program assertion and program time can be determined by the pulse width of PGM. So do the erase mode. Finally, the operations are ended with a stop condition. Since the CLK can be shared with the system clock of the integrated circuit, the additional pin for NVM is then the one external pin is PGM.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF THE INVENTION

Figure 1:
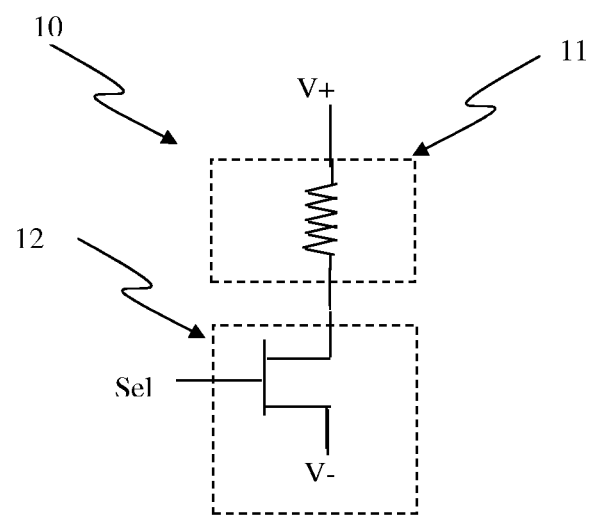
FIG. 1 shows a conventional OTP cell.
Figure 2:
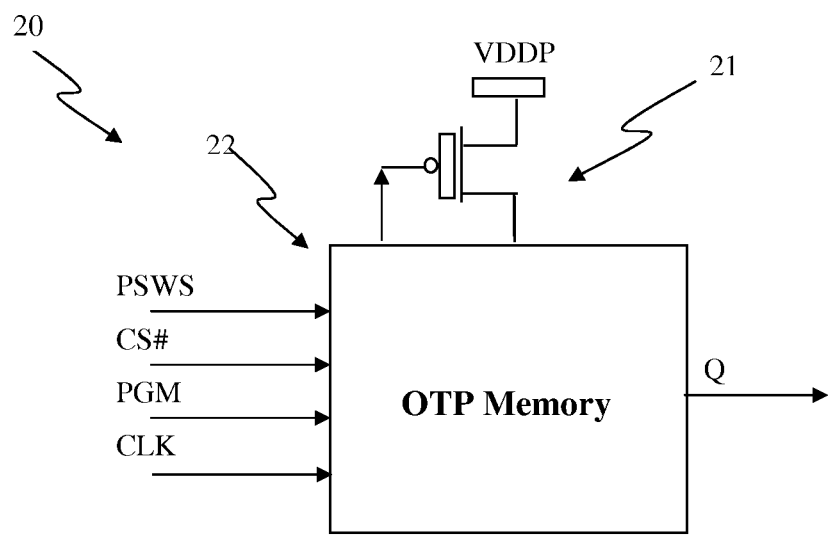
FIG. 2 shows a pin configuration of a conventional serial OTP memory.
Figure 3A:
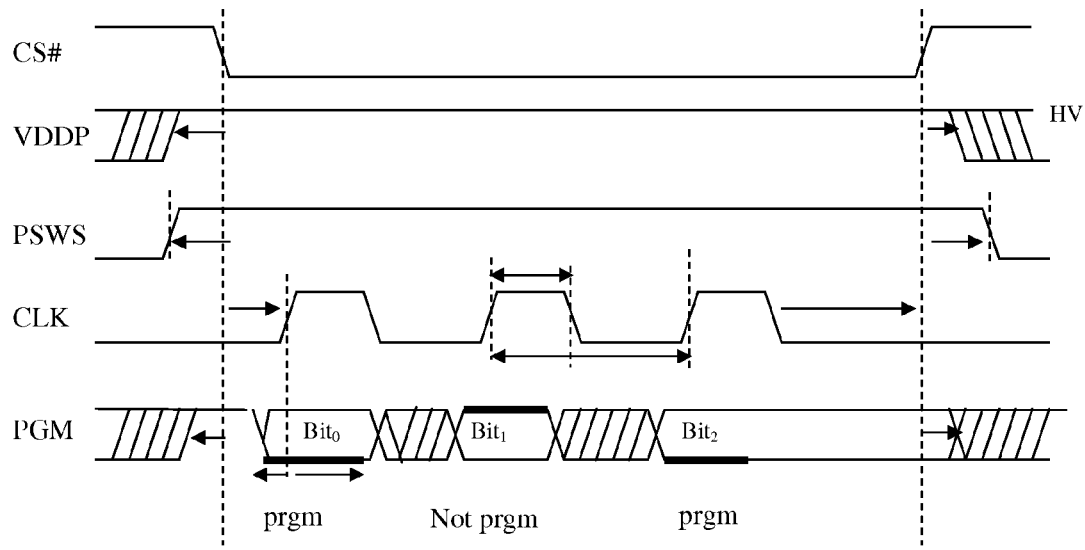
FIG. 3(a) shows a program timing waveform of a serial OTP memory.
Figure 3B:
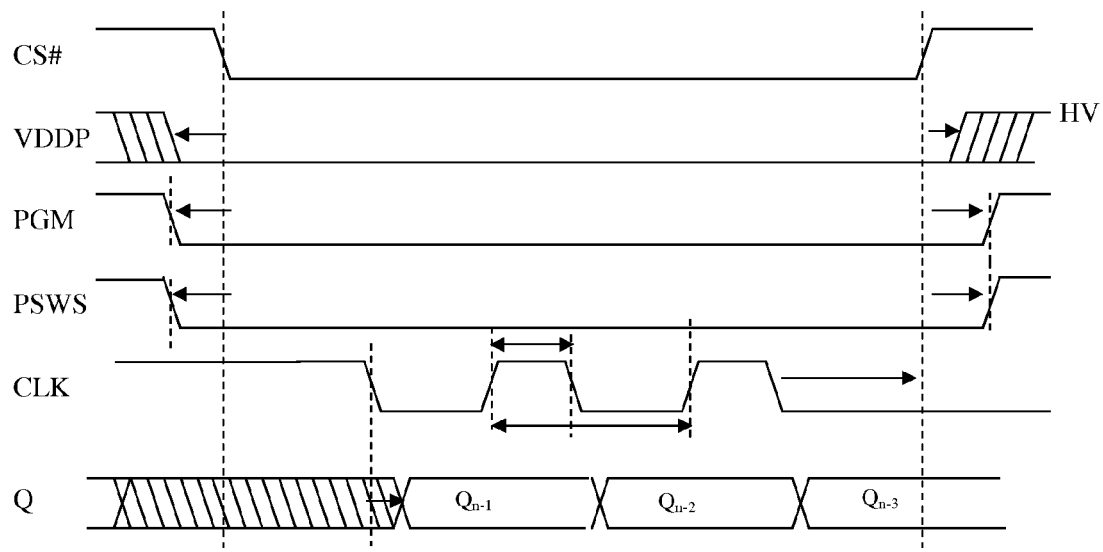
FIG. 3(b) shows a read timing waveform of a serial OTP memory.

The invention relates to a low-pin-count non-volatile memory (NVM) having reduced area and footprint. In one embodiment, the low-pin-count non-volatile memory can use an interface that makes use of only one pin external to an integrated circuit. This interface not only can use only one external pin but also can share several internal pins with the rest of integrated circuit to thereby reduce area and footprint. Moreover, if desired, the one external pin can be further multiplexed with the other pins so that no additional pins are needed. In one embodiment the interface can pertain to a low-pin-count OTP interface for an OTP memory so that the OTP memory can be easily integrated into an integrated circuit.

Simply employing a serial interface is not sufficient for an OTP memory because an OTP memory requires high voltage programming control and has a much longer program time than read time. Also, getting into a program mode at a specific address should be immune to noises and be secure to prevent corrupting data.

In one embodiment, a non-volatile memory interface can uses only two signals, PGM and CLK for program control and clock, respectively. By comparing the relative phase between these two signals, the start and stop conditions can be detected. In addition, device ID, read/program/erase mode, and starting address can be determined. Thereafter, read, program, or erase sequences can be signaled. Program assertion and program time can be determined by the pulse width of PGM in program mode. Similarly erase assertion and erase time can be determined by the pulse width of PGM in erase mode. Finally, the operations are ended with a stop condition or running through the whole memory. Since the CLK can be shared or derived from a system clock of the integrated circuit, the additional pin for NVM is then the one external pin denoted PGM.

This invention discloses a two-pin count NVM interface with PGM and CLK for program control and clock, respectively. The CLK can be derived from a system clock in an integrated circuit so that only one additional pin PGM is required for the NVM. In addition, the PGM pin can be further multiplexed with other pins in the integrated circuit to reduce external pins. In the NVM applications for chip ID, serial number, or inventory control, the data are written into and read out from the NVM by controlling the external pin, such as PGM. To further save pin count, the control pin PGM and data output pin Q can be shared in a bi-directional I/O, PGM/Q. This mode is called hardware read and write (HW R/W). In other NVM applications such as security key, PROM code, or configuration parameters, the data stored in NVMs can only be read internally for security reasons, though programming or erasing is still achieved by controlling the external pins. This mode is called hardware write and software read (HW-W-SW-R). The required I/O pins are CLK, PGM, Q, and PGMi. PGM is the only external pin needed for control programming, while PGMi is an internal pin for control reading.

The invention can be implemented in numerous ways, including as a method, system, device, or apparatus (including computer readable medium). Several embodiments of the invention are discussed below.

Figure 4A:
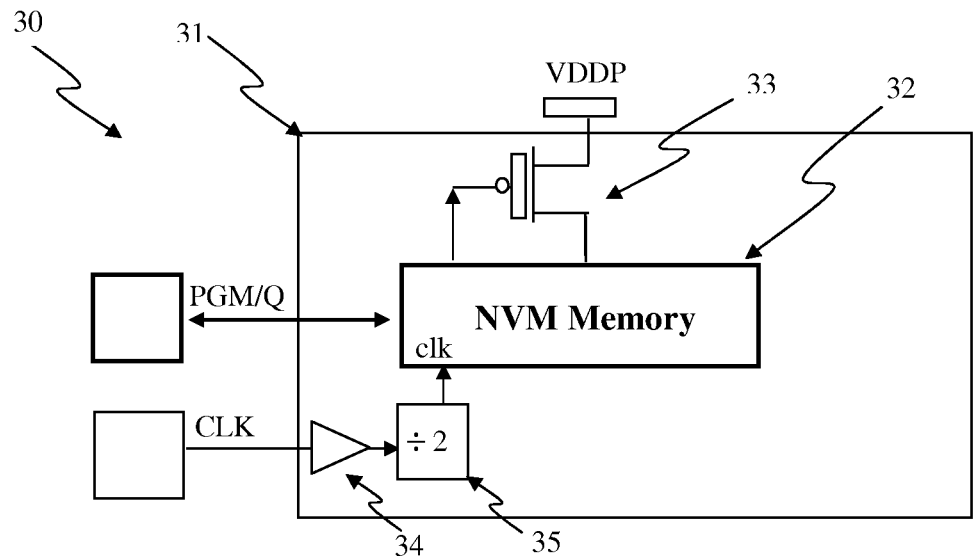
FIG. 4(a) shows a one-pin NVM with hardware read/write (HW R/W) according to one embodiment.

FIG. 4(a) shows a one-pin NVM 30 with hardware read/write (HW R/W) according to one embodiment. An integrated circuit 31 has an NVM memory 32 and a power-switch device 33 coupled between a high voltage pin VDDP and the NVM memory 32. The NVM memory 32 has one pin, clk, internal to the integrated circuit 31 and another pin, PGM/Q, external to the integrated circuit 31. The clk pin can be obtained from an external system clock, CLK, with a buffer 34 and a frequency divider 35. The frequency divider 35, such as divided-by-2, can make phase alignment between PGM/Q and CLK much easier, and therefore this is one suitable embodiment. It is important to have CLK externally accessible, because generating PGM/Q timing should be aligned with the CLK. PGM/Q is a bi-directional I/O pin that can be used to set control signals as well as to get data out.

Figure 4B:
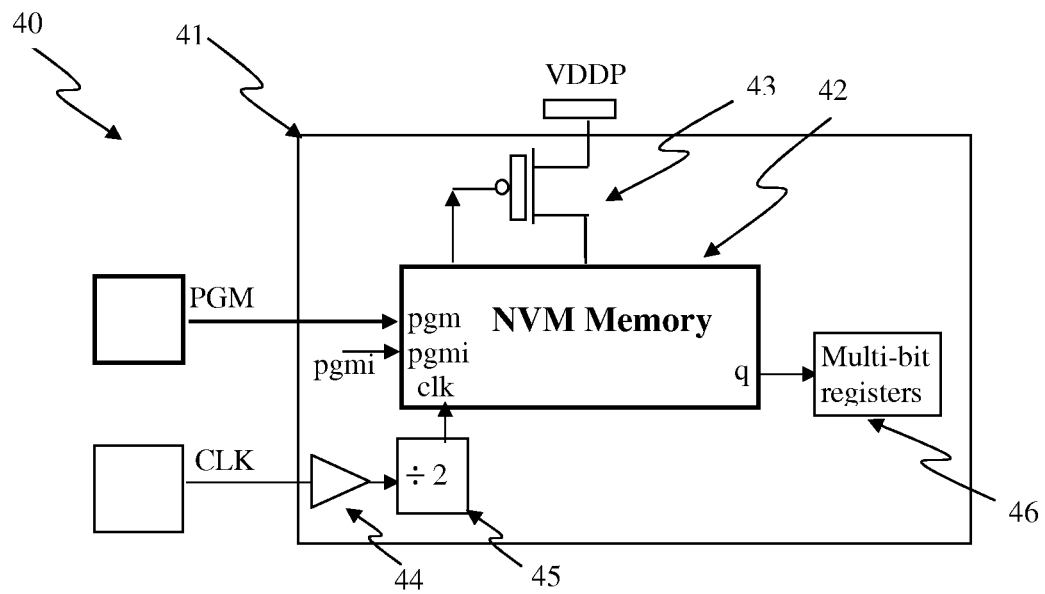
FIG. 4(b) shows a one-pin NVM with hardware write and software read (HW-W-SW-R) according to one embodiment.

FIG. 4(b) shows a one-pin NVM 40 with hardware write and software read (HW-W-SW-R) according to one embodiment. An integrated circuit 41 has an NVM memory 42 and a power-switch device 43 coupled between a high voltage pin VDDP and the NVM memory 42. The NVM memory 42 has three pins, pgmi, clk, and q internal to the integrated circuit 41 and one pin PGM external to the integrated circuit 41. The clk pin can be obtained from an external system clock, CLK, with a buffer 44 and a frequency divider 45. The frequency divider 45, such as a divided-by-2 or higher, can make the phase alignment between PGM and clk can be much easier. It is important to have CLK externally accessible, because generating PGM timing should be aligned with the CLK. Pgmi is a control signal for read, similar to PGM for program and erase. Data pin q is a data out to a multi-bit registers 46 so that the content of the NVM can be accessed by software reading the registers 46.

Figure 5A:
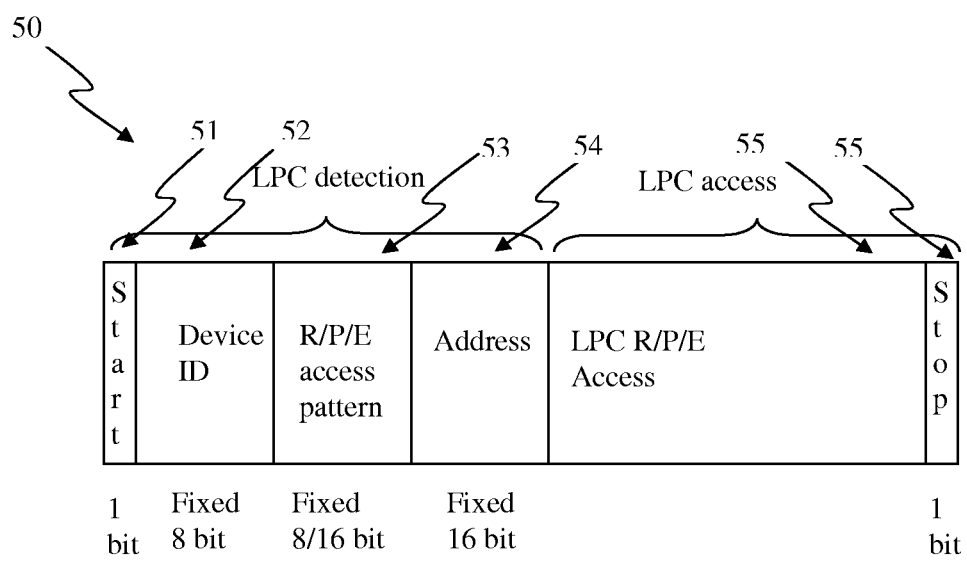
FIG. 5(a) shows a low-pin-count NVM I/O protocol according to one embodiment.

FIG. 5(a) shows a low-pin-count NVM I/O protocol 50 according to one embodiment. The I/O transaction starts with a start bit 51 and ends with a stop bit 55. After detecting the start bit 51, there is a fixed 8-bit device ID code 52 to specify device names and types, such as SRAM, ROM, OTP or device 1, device 2, etc., to access. In one embodiment, device can grant access only when the requested device ID matches the target device ID. Then, there is multiple-bit pattern 53 to specify read, program, or erase. It is very important for an NVM to prevent accidental programming or erasing so that programming or erasing can happen only when detecting special data patterns. The special data pattern to unlock programming can be a log sequence of alternative zeros and ones such as 0101,0101,0101,0101 for read, 1010,1010,1010,10101 for program, and 0101,0101,1010, 1010 for erase. The next field is a starting address 54. Sixteen bits in the address 54 allows memory capacity up to 64K bits. This field can be extended by itself when detecting a device in field 52 that has capacity higher than 64 Kb or using more bits in the address 54. After knowing the device type, read, program, or erase operation, and starting address in fields 52, 53, and 54, respectively, the next step is the actual read, program, or erase. The data access ends when detecting a stop bit 55, or running through the whole memory. The R/P/E access patterns 53 as noted above are exemplary. It will be apparent to those skilled in the art that various modifications and variations can be made.

If the capacity of the NVM is very low, such as 32 bits or 256 bits, a conventionally rather long LPC detection sequence may defeat the purpose of a simple and reliable I/O protocol. Hence, according to one aspect of embodiment of the invention, a simplified I/O protocol can be provided which has a substantially reduced LPC detection sequence.

Figure 5B:
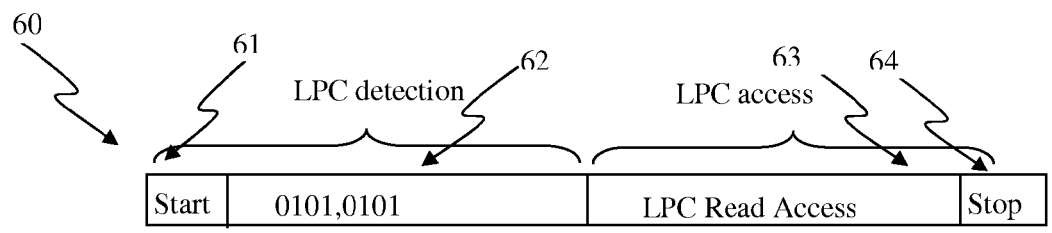
FIG. 5(b) shows a simplified version of low-pin-count NVM protocol for READ according to one embodiment.
Figure 5C:
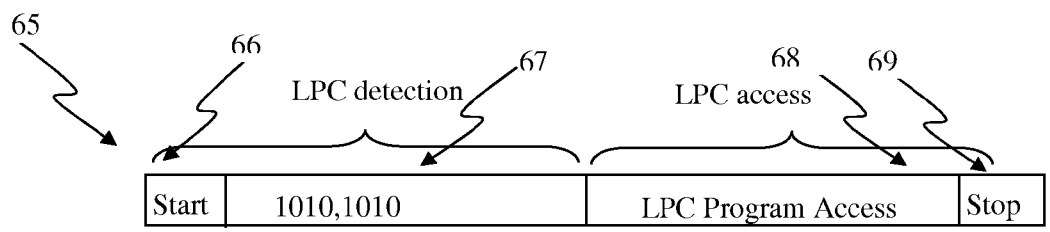
FIG. 5(c) shows a simplified version of low-pin-count NVM protocol for PROGRAM according to one embodiment.
Figure 5D:
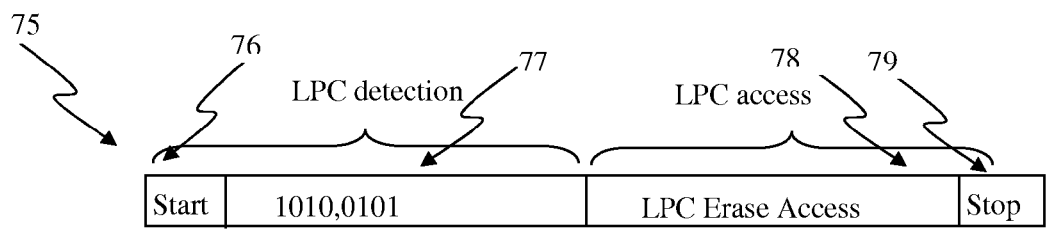
FIG. 5(d) shows a simplified version of low-pin-count NVM protocol for ERASE according to one embodiment.

FIGS. 5(b), 5(c), and 5(d) show simplified versions of low-pin-count NVM protocols for read, program, and erase, respectively, according to one embodiment. FIG. 5(b) shows a low-pin-count read protocol 60 with a start bit 61, LPC detection field 62, LPC Read access 63, and stop bit 64. Similarly, FIG. 5(c) shows a low-pin-count program protocol 65 with a start bit 66, LPC detection field 67, LPC program access 68, and stop bit 69. FIG. 5(d) shows a low-pin-count erase protocol 75 with a start bit 76, LPC detection field 77, LPC erase access 78, and stop bit 79. A simple read, program, or erase sequence, such as 0101,0101, 1010,1010, or 1010, 0101 respectively, grant read, program or erase access in a low capacity NVM. The device ID and starting address fields are omitted. The address starts with the lowest possible address and increments by one after each access. Those skilled in the art understand that the above descriptions are for illustrative purpose. The numbers of fields, number of bits in each field, the order of the fields, address increment/decrement, and actual R/P/E patterns may vary and that are still within the scope of this invention.

Figures 6A, 6B:
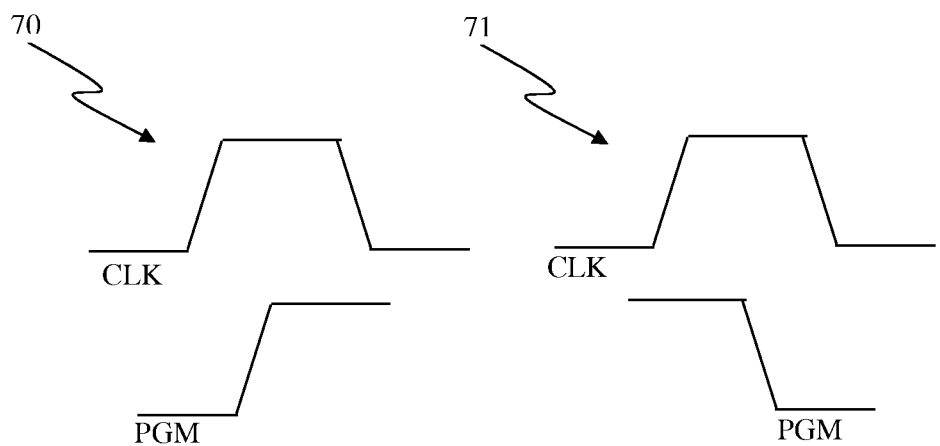
FIG. 6(a) shows a start bit waveform according to one embodiment.
FIG. 6(b) shows a stop bit waveform according to one embodiment.

FIGS. 6(a) and 6(b) show one embodiment of start and stop bit waveforms. When the I/O transaction is inactive, the control signal PGM always toggles at the low CLK period. If the PGM toggles at the high CLK period, this indicates a start or stop condition. The PGM going high during the high CLK period shows a start condition and the PGM going low during the high CLK period shows a stop condition. By using the relative phase between the PGM and the CLK, a chip select function can be provided and a chip select CS# pin can be saved.

Figure 7A:
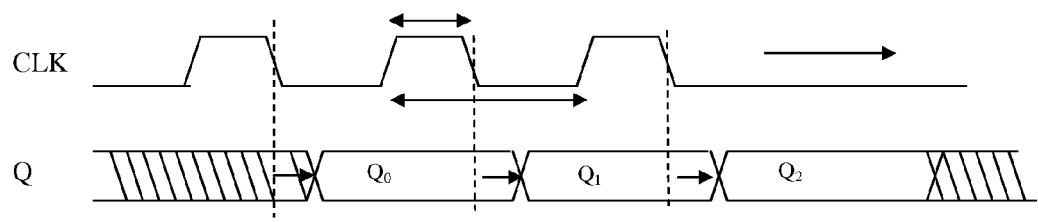
FIG. 7(a) shows a read timing waveform of a low-pin-count NVM in read mode according to one embodiment.

FIG. 7(a) shows a read timing waveform of a low-pin-count NVM in read mode according to one embodiment. Once a read transaction is detected, the data in the NVM can be read out one bit at a time at each falling CLK edge from the starting address. The starting address can be specified in the address field or can be implied as being the lowest possible address. The address can be auto-incremented by one after each access. In a bi-direction I/O, PGM/Q pin is left floating externally after LPC read stage so that the same pin can be used for outputting data.

Figure 7B:
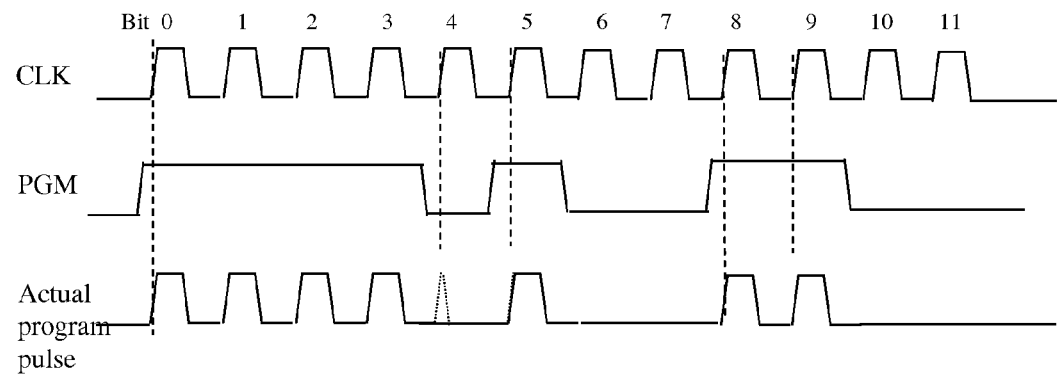
FIG. 7(b) shows a program timing waveform of a low-pin-count NVM in program mode according to one embodiment.

FIG. 7(b) shows a program timing waveform of a low-pin-count NVM in a program mode according to one embodiment. Once a program condition is detected, the I/O transaction goes into the actual programming cycles from the starting address. In one embodiment, the address increments at each falling edge of CLK and programming for each bit determined if the PGM is high at the rising edge of each CLK. For example, the PGM is high at the CLK rising edge of bit 0, 1, 2, and 3 so that bit 0, 1, 2, and 3 are programmed during the CLK high period. Since PGM is low at the CLK rising edge of bit 4, bit 4 is not programmed. By doing this way, each CLK toggling increments the bit address by one and the PGM high or low at each CLK rising edge determines that bit being programming or not. Actual programming time is the CLK high period.

Figure 7C:
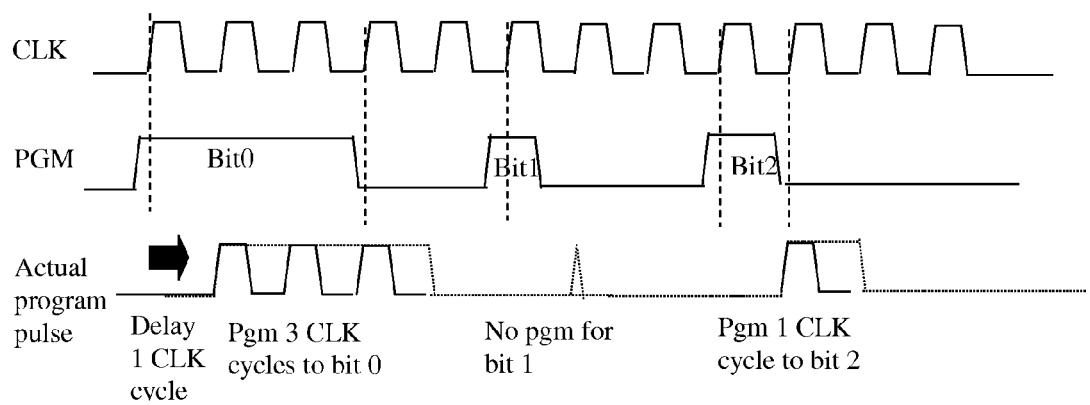
FIG. 7(c) shows a program timing waveform of a low-pin-count NVM in program mode according to another embodiment.

FIG. 7(c) shows a program timing waveform of a low-pin-count NVM in an program mode according to another embodiment. Once the program condition is detected, the I/O transaction goes into the actual programming cycles from the starting address. The program address increments after each low-to-high transition of PGM. The actual program timing depends on the number of whole CLK cycles within each PGM high pulse. For example, in bit 0 the PGM pulse width is larger than 3 CLK cycles to enable actual programming for 3 CLK cycles. In bit 1, the PGM pulse width is less than one CLK period so that bit 1 is not programmed. In bit 2, the PGM pulse width is greater than one CLK period so that bit 2 is programmed for 1 CLK cycle. By doing this way, the CLK frequency can be the same for both read and program, while the program period can be determined by the number of CLK high period in the PGM high pulse width. The actual program pulses can be delayed by one CLK period to make determining number of CLK cycles easier. The embodiments in FIGS. 7(b) and 7(c) can be applied to erase mode too. In some NVM, an erase operation happens on a page basis. In that case, the erase address can represent a page address, instead of a bit address.

Figure 8A:
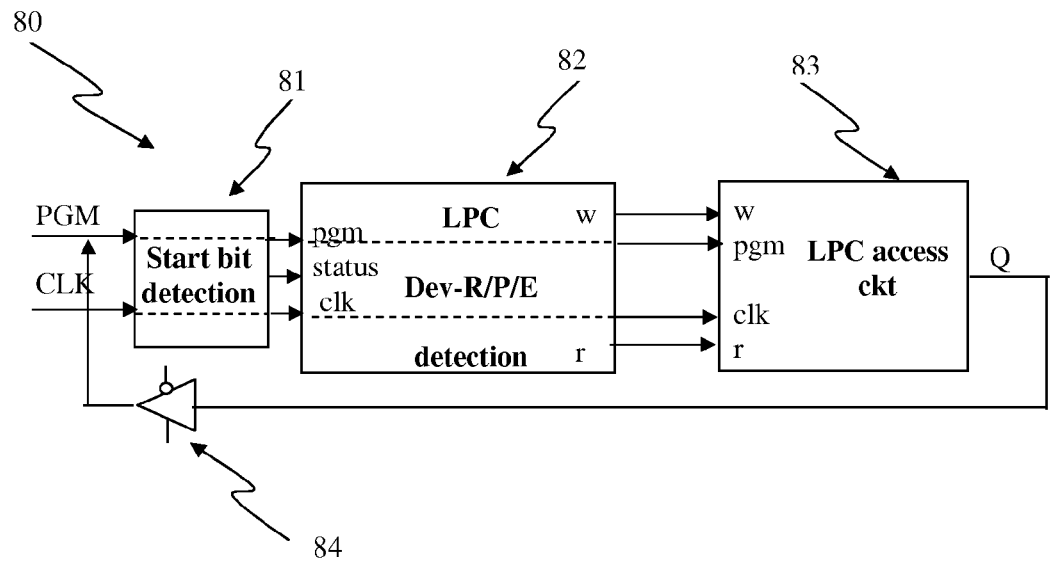
FIG. 8(a) shows a block diagram of a HW R/W low-pin-count NVM according to one embodiment.

FIG. 8(a) shows a block diagram of a HW R/W low-pin-count NVM 80 according to one embodiment. A start bit detection block 81 detects if a starting condition is met by the relative phase between PGM and CLK as shown in FIGS. 6(a) and 6(b). If yes, a LPC Dev-RPE detection block 82 detects if a device ID and read/program/erase access pattern are met, and then obtains a starting address. With a valid read, program, or erase status and the starting address, a LPC access block 83 performs actual read, program, and erase cycles. If the I/O transaction is a read, a tri-state buffer 84 is asserted so that the output Q is re-directed into the same PGM pin (which can serve as a shared PGM/Q pin).

Figure 8B:
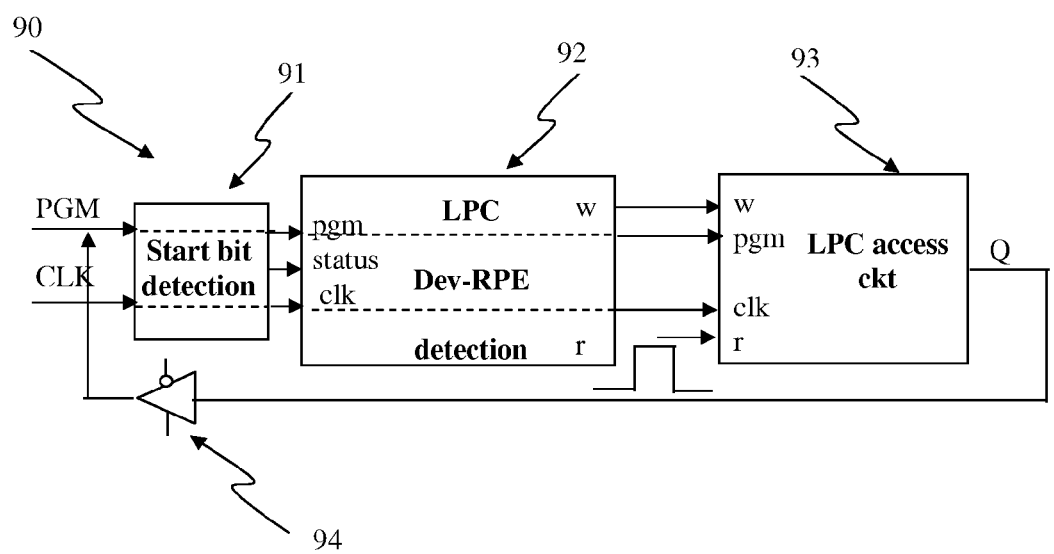
FIG. 8(b) shows a block diagram of another embodiment of HW R/W low-pin-count NVM according to one embodiment.

FIG. 8(b) shows a block diagram of a HW R/W low-pin-count NVM 90 according to one embodiment. A start bit detection block 91 detects if a starting condition is met by the relative phase between PGM and CLK as shown in FIGS. 6(a)

and 6(b). If yes, a LPC Dev-RPE detection block 92 further detects if a device ID and program, or erase access pattern are met, and then obtains a starting address. With a valid program, or erase status and the starting address, a LPC access block 93 performs actual program and erase cycles. Granting read access can be made simple by asserting a level or a pulse signal in another embodiment, since read is not a destructive operation. If the I/O transaction is a read, the tri-state buffer 94 is asserted so that the output Q is re-directed into the same PGM pin (which can serve as a shared PGM/Q pin).

Figure 9A:
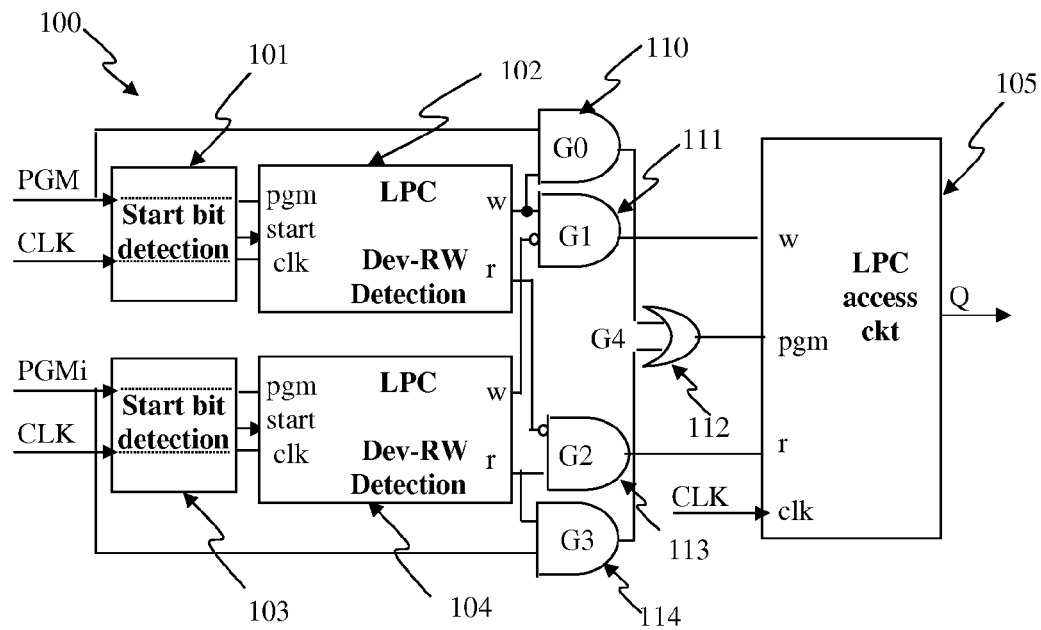
FIG. 9(a) shows one embodiment of a block diagram for HW-W-SW-R low-pin-count NVM according to one embodiment.

FIG. 9(a) shows one embodiment of a block diagram 100 for a HW-W-SW-R low-pin-count NVM according to one embodiment. Read and program/erase paths determined by PGM and PGMi go through start bit detection blocks 101 and 103, and LPC Dev-RW detection blocks 102 and 104, separately. These two paths are combined after each block's read and program/erase statuses are determined. The combined program/erase status is a program/erase in program/erase path but not in the read path as realized in gate 111. Similarly, the combined read status is a read in the read path but not in the erase/program path as realized in gate 113. The combined PGM is a program/erase if program/erase status in the program/erase path is asserted, or PGMi if the read status in the read path is asserted, as realized in gates 110, 114, and 112. The data in output Q from a LPC access circuit 105 are stored in internal registers (not shown). The PGMi is held low during program/erase and the PGM is held low during read to prevent interference of read and program/erase. The program/erase status can be two separate bits to indicate either program or erase condition, so are the gates 110 and 111 replicated for program/erase.

Figure 9B:
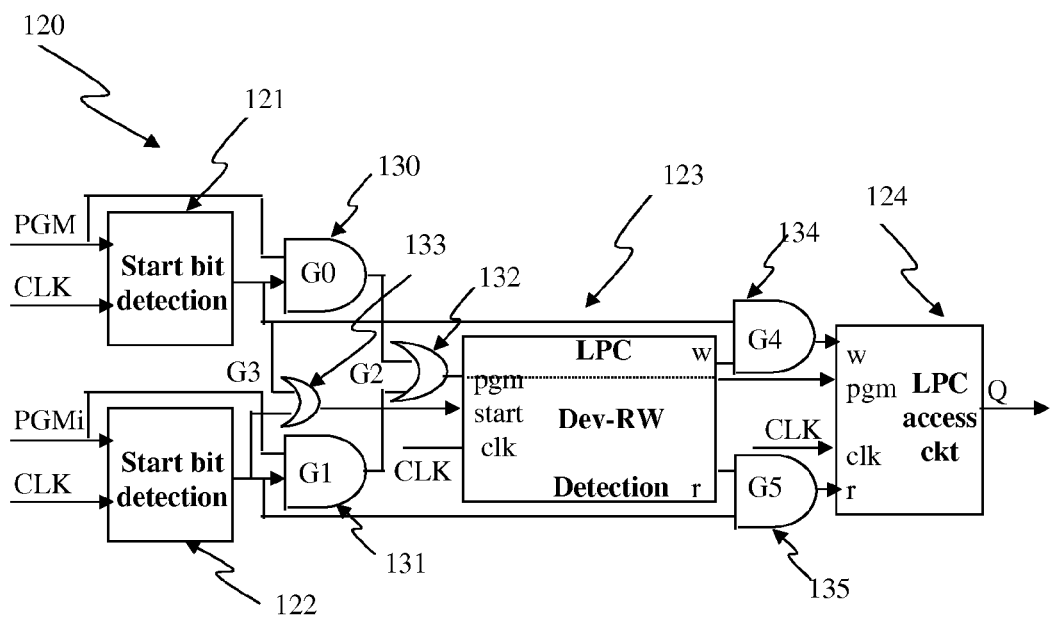
FIG. 9(b) shows yet another embodiment of a block diagram for HW-W-SW-R low-pin-count NVM according to one embodiment.

FIG. 9(b) shows another embodiment of a block diagram 120 for a HW-W-SW-R low-pin-count NVM according to one embodiment. Program/erase and read paths are merged after each path detecting a start bit in 121 and 122, respectively, so that some hardware can be shared. Then the start bits are OR'd to generate a combined start bit as realized in gate 133. The combined PGM at the output of gate 133 indicates a program/erase if a start bit is detected in the program/erase path, or indicates a read if a start bit is detected in the read path, as realized by gates 130, 131, and 132. Then, a single LPC Dev-RW detection block 123 detects device ID, R/P/E pattern, and starting address, if any. A program/erase status detected in the single LPC Dev-RW detection block 123 with a start bit detected in the program/erase path is considered a valid program/erase condition as realized by gate 134. Similarly, a read status detected by the single LPC Dev-RW detection block 123 with a start bit detected in the read path is considered a valid read condition as realized by gate 135. The valid program/erase and read conditions trigger the follow on LPC access circuit 124. Output Q from the LPC access circuit 124 are stored in internal registers (not shown). The block diagram in FIG. 9(b) is the preferred embodiment over that in FIG. 9(a) because the implementation cost is lower. The PGMi is held low during program/erase and the PGM is held low during read to prevent interference of read and program/erase. The program/erase status can be two separate bits to indicate either program or erase condition, so is the gate 134 replicated for program/erase.

Figure 10:
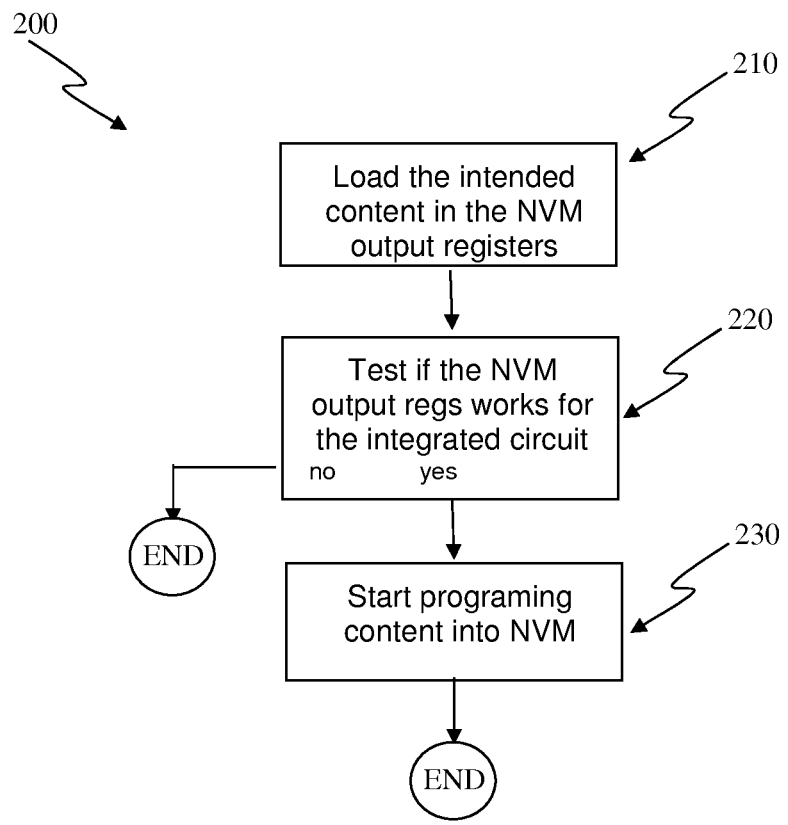
FIG. 10 shows a soft program procedure for a low-pin-count NVM according to one embodiment.

In most applications, the NVM data are for device trimming, configuration parameters, memory repair, or MCU code. Normally, data is loaded into registers to test if they function properly before actually programming which can prevent false programming. This technique is called soft program. FIG. 10 shows a soft-program procedure 200 for a low-pin-count NVM. The procedure 200 starts with loading the intended NVM data into output registers in 210. Then, the registers are tested to check if they function as expected at 220. If not, no programming would occur. If yes, proceed to start programming the content into the NVM at 230 and stop after finishing. Soft programming is especially useful for OTP because such devices can be only programmed once.

Figure 11A:
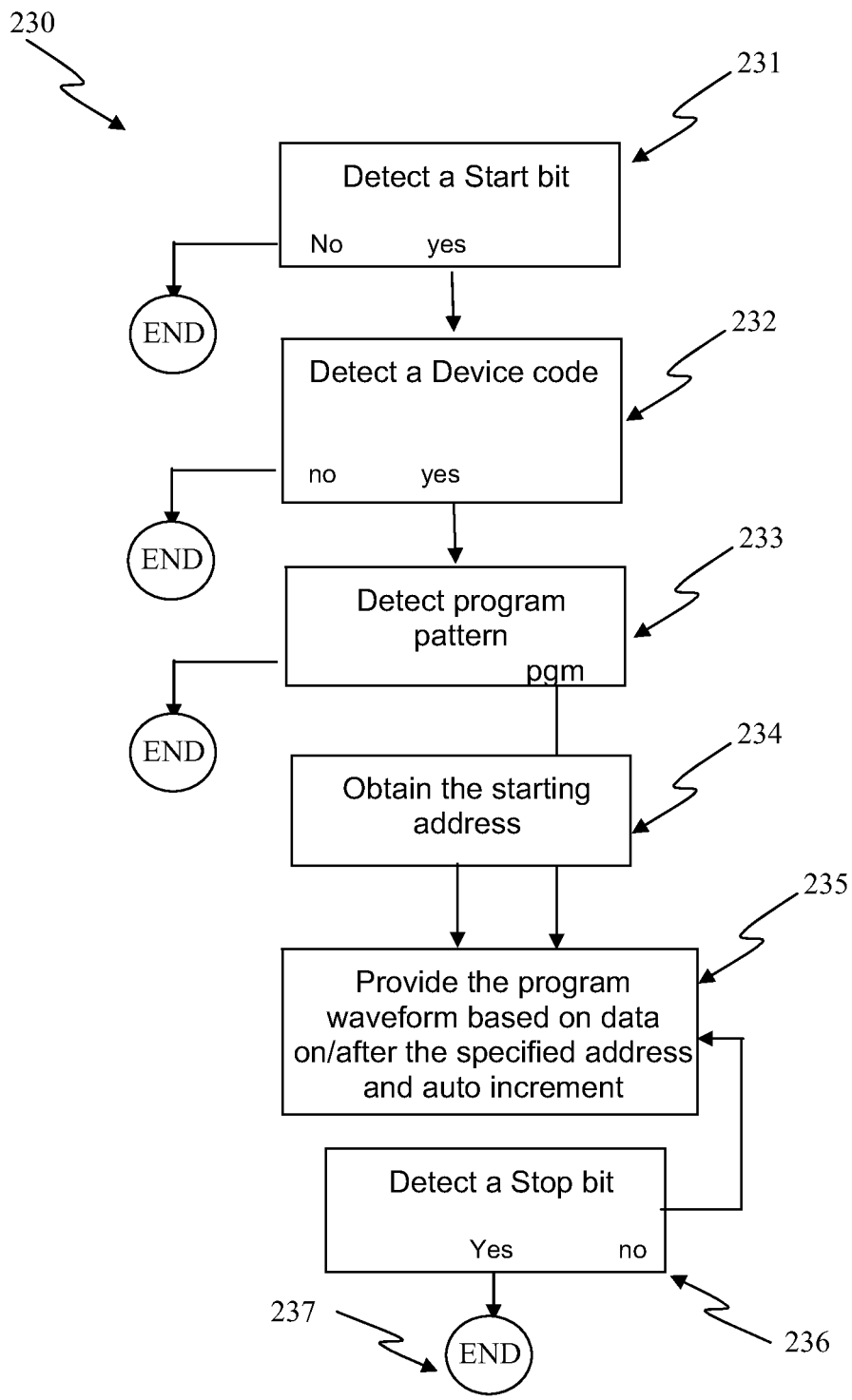
FIG. 11(a) shows a program procedure for a low-pin count NVM according to one embodiment.

FIG. 11(a) shows a program procedure 230 for a low-pin-count NVM according to one embodiment. The procedure 230 starts with detecting a start bit at 231. If a start bit is detected, proceed to detect a valid device ID at 232, if not detected the procedure 230 ends. Then, the procedure 230 proceeds to detect a program pattern at 233, if not detected the procedure 230 ends. The procedure 230 continues to obtain a starting address in 234. After the start bit, device ID, write pattern, and starting address are checked and obtained, the next step provides an adequate program waveform based on the data for the corresponding address at 235 and auto increment the address after each programming. The programming progresses until a stop bit is detected in 236, then the procedure 230 finishes at 237. The above discussion is for illustration purposes. For those skilled in the art understand that some steps can be omitted, the number of bits in each bit field can be different, the bit field order can be interchangeable and that are still within the scope of this invention.

Figure 11B:
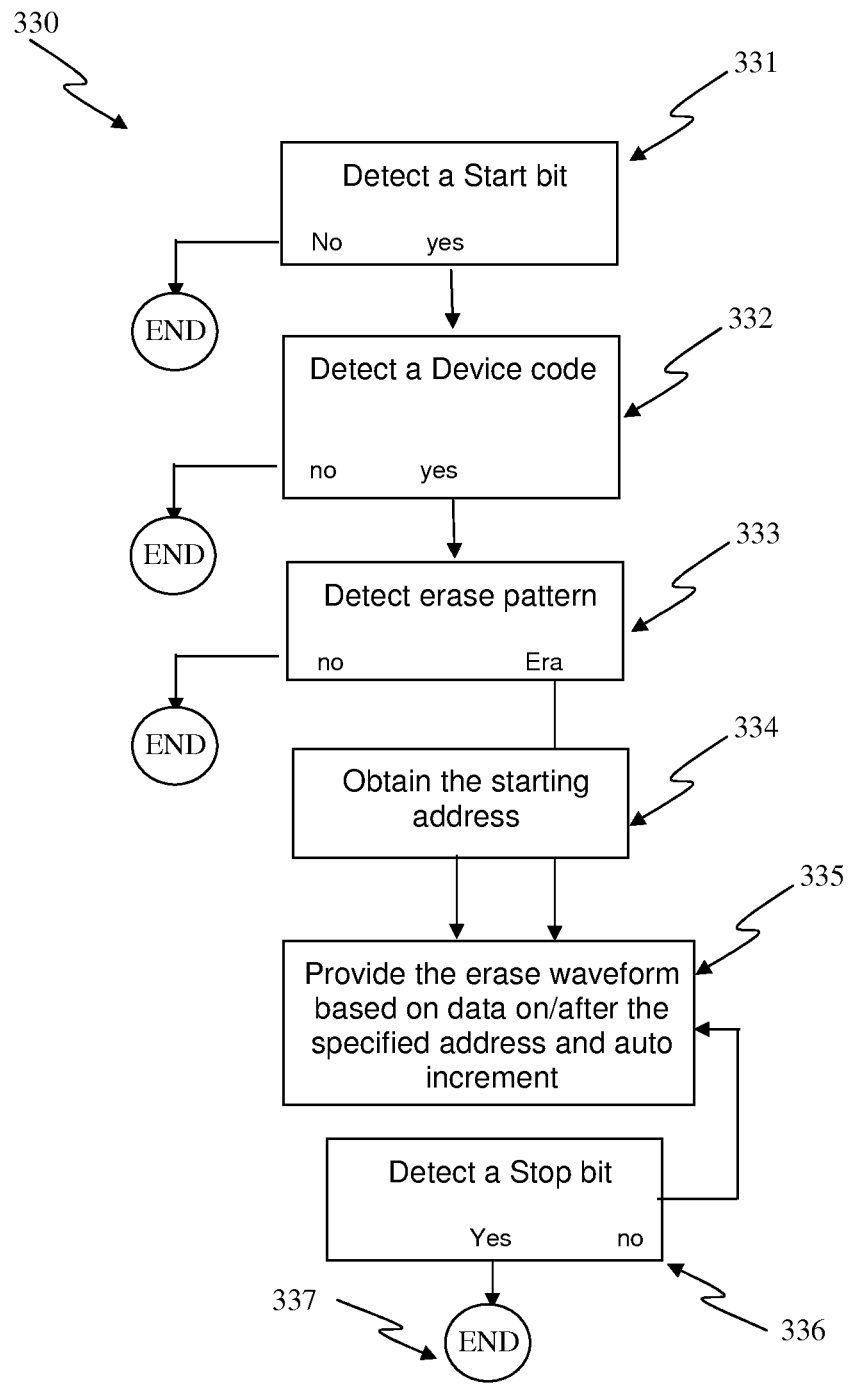
FIG. 11(b) shows an erase procedure for a low-pin count NVM according to one embodiment.

FIG. 11(b) shows an erase procedure 330 for a low-pin-count NVM according to one embodiment. The procedure 330 starts with detecting a start bit at 331. If a start bit is detected, proceed to detect a valid device ID at 332, if not detected the procedure 330 ends. Then, the procedure 330 proceeds to detect an erase pattern at 333, if not detected the procedure 330 ends. The procedure 330 continues to obtain a starting address at 334. After the start bit, device ID, write pattern, and starting address are checked and obtained, the next step provides an adequate erase waveform based on the data for the corresponding address at 335 and auto increment the address after each erasing. The erasing progresses until a stop bit is detected at 336, then the procedure 330 finishes at 337. The above discussion is for illustration purposes. For those skilled in the art understand that some steps can be omitted, the number of bits in each bit field can be different, the bit field order can be interchangeable and that are still within the scope of this invention.

Figure 12:
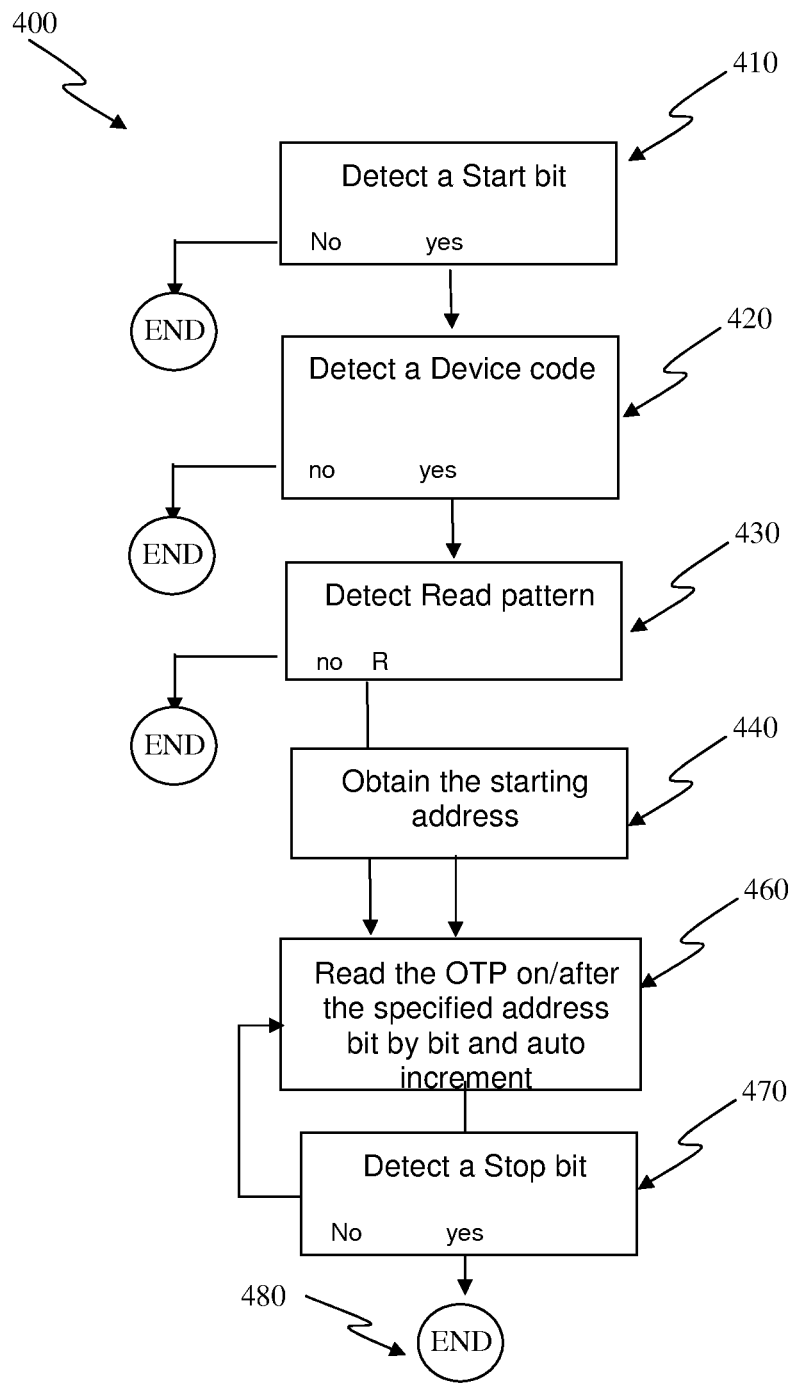
FIG. 12 shows a read procedure for a low-pin-count NVM according to one embodiment.

FIG. 12 shows a read procedure 400 for a low-pin-count NVM according to one embodiment. The procedure 400 starts with detecting a start bit at 410. If a start bit is detected, proceed to detect a device ID at 420, if not detected, end procedure 430. Then, proceeds to detect a read pattern at 430. The procedure 430 continues obtaining a starting address at 440. After the start bit, device ID, read pattern, and starting address are checked and obtained, the next step is to read data bit by bit at the rising or falling edge of each clock cycle at 460 and auto increment the address after each access. The read progresses until a stop bit is detected at 470, then the procedure 400 finishes with an end at 480. The above discussion is for illustration purposes. For those skilled in the art understand that some steps can be omitted, the number of bits in each bit field can be different, the bit field order can be interchangeable and that are still within the scope of this invention.

The block diagrams shown in FIGS. 8(a), 8(b), 9(a), and 9(b) are for illustrative purpose. The actual circuit and logic implementations may vary. Similarly, the procedures described in FIGS. 10, 11(a), 11(b), and 12 are for exemplifying purposes. The detailed implementation in the procedures may vary. For example, some steps may be skipped if simplified versions of read, program, or erase protocols in FIG. 5(b), 5(c), or 5(d) are employed. There can be many embodiments of the circuit, logic, block diagram, and procedures and that are still within the scope of this invention for those skilled in the art.

Figure 13:
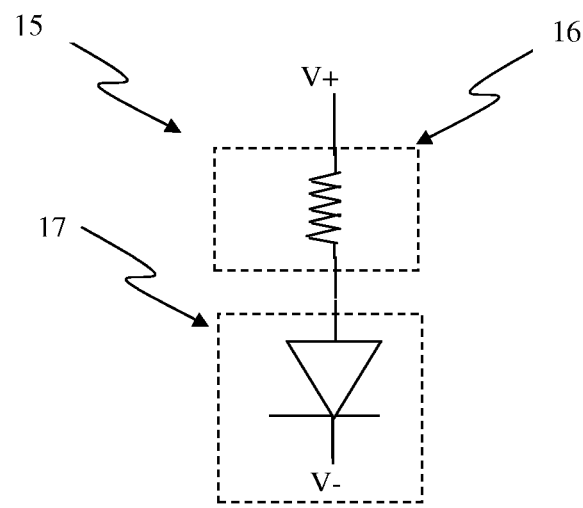
FIG. 13 shows an OTP cell using a diode as program selector according to one embodiment.

FIG. 13 shows an OTP cell 15 as a particular NVM cell using a diode as program selector according to one embodiment. The OTP cell 15 has an OTP element 16 and a program selector 17. The OTP element 16 is coupled to a supply voltage V+ in one end and a program selector 17 at the other. The program selector 17 has the other end coupled to a second supply voltage V−. The program selector is constructed from a diode that can be embodied as a junction diode with a P+ active region on N-well, or a polysilicon diode with P+ and N+ implants on two ends of the polysilicon to constitute a diode. The OTP elements 16 are commonly electrical fuse based on polysilicon or silicided polysilicon, or anti-fuse based on gate oxide breakdown. The low-pin-count NVM interface is readily applicable to the OTP cell 15.

To further reduce the footprint, the one-pin NVM circuit can be built under the bonding pad of PGM, in the so-called Circuit-Under-Pad (CUP) technology. The Electrostatic Discharge (ESD) protection can be integrated into the one-pin NVM as well. The output driver of a bi-directional I/O can act as ESD protection for the external pin PGM.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A low-pin-count non-volatile memory (NVM) integrated in an integrated circuit comprises:
   a plurality of NVM cells;
   a clock signal internal to the integrated circuit coupled to a system clock of the integrated circuit; and
   a control signal external to the integrated circuit to generate start, stop, read, program, or erase conditions with timing related to the clock signal for read, program, or erase condition; wherein the program or erase period, including zero program or erase period, being determined by the pulse width of the control signal once program or erase condition is determined.

2. A low-pin-count NVM as recited in claim 1, wherein at least one start or stop bit is determined by toggling the control signal related to high or low period of the clock signal.

3. A low-pin-count NVM as recited in claim 1, wherein the program address or erase page address increments or decrements when the control signal rises or falls after actual programming or erasing begins.

4. A low-pin-count NVM as recited in claim 1, wherein no programming or erasing happens if the pulse width of the control signal is less than one clock period.

5. A low-pin-count One-Time-Programmable (OTP) non-volatile memory integrated in an integrated circuit comprises:
   a plurality of OTP cells, at least one of the cells including at least an OTP element coupled to a first supply voltage line, and a program selector coupled to the OTP element and to a second supply voltage line;
   a clock signal internal to the integrated circuit and coupled to a system clock of the integrated circuit; and
   a control signal provided to the integrated circuit to generate start, stop, read or program conditions with timing related to the clock signal for read or program, wherein a program period for programming the OTP element is determined based on a pulse width of the control signal.

6. A low-pin-count OTP non-volatile memory as recited in claim 5, wherein at least one start or stop bit is determined by toggling the control signal related to a high or low period of the clock signal.

7. A low-pin-count OTP non-volatile memory as recited in claim 5, wherein a program address for programming increments or decrements when the control signal rises or falls after programming begins.

8. A low-pin-count OTP non-volatile memory as recited in claim 5, wherein the program period is equal to or less than the whole clock cycles that fit into the pulse width of the control signal.

9. A low-pin-count OTP non-volatile memory as recited in claim 5, wherein no programming happens if the pulse width of the control signal is less than one clock period.

10. A low-pin-count OTP non-volatile memory as recited in claim 5, wherein a plurality of bits to specific a starting address are detected before proceeding to read or program.

11. A low-pin-count OTP non-volatile memory as recited in claim 5, wherein the read data are multiplexed and output to the same control signal for external access.

12. A low-pin-count OTP non-volatile memory as recited in claim 5, wherein a plurality of bits for valid device identity are detected before proceeding to read or program.

13. A low-pin-count OTP non-volatile memory as recited in claim 5, wherein the OTP is built under a bonding pad of a pin of the integrated circuit for the control signal.

14. A low-pin-count OTP non-volatile memory as recited in claim 5, wherein the OTP is integrated with an Electro-Static Discharge (ESD) device for a bonding pad.

15. A low-pin-count OTP non-volatile memory as recited in claim 5, wherein the program selector of the OTP cell includes at least a diode or MOS constructed from source or drain of a CMOS on a CMOS well.

16. A low-pin-count OTP non-volatile memory as recited in claim 5, wherein the program selector of the OTP cell is a diode constructed from a polysilicon structure.

17. A method for providing a low-pin-count OTP memory in an integrated circuit comprises:
   providing a plurality of OTP cells, at least one of the cells including an OTP element coupled to a first supply voltage line, and a program selector coupled to the OTP element and to a second supply voltage line;
   receiving a clock signal internal to the integrated circuit coupled to a system clock of the integrated circuit; and
   receiving a control signal external to the integrated circuit to generate start, stop, read or program conditions with timing related to the clock signal for program or read, wherein a program period, including zero program period, is determined by a pulse width of the control signal.

18. A method as recited in claim 17, wherein the program address increments or decrements when the control signal rises or falls after actual programming begins.

19. A method as recited in claim 17, wherein the program period is equal or less than the whole clock cycles that fits into the pulse width of the control signal.

20. A method as recited in claim 17, wherein no programming happens if the pulse width of the control signal is less than one clock period.

21. A method as recited in claim 17, wherein read data are multiplexed and output to the same control signal for external access.

22. A method as recited in claim 17, wherein a plurality of bits for device identification are detected before proceeding to read or program.

23. An electronic device providing data storage, comprising:
   a low-pin-count non-volatile memory (NVM) integrated circuitry comprises a plurality of NVM cells;

a clock input configured to receive a system clock of the electronic device;

a control input configured to receive a control signal for controlling operation of the low-pin-count non-volatile memory (NVM) integrated circuitry; and control logic coupled to the control input and the low-pin-count non-volatile memory (NVM) integrated circuit, and configured to generate start, stop, read, program, or erase conditions for read, program, or erase operations with respect to the NVM cells, wherein a program or erase period is determined by a pulse width of the control signal once program or erase condition is determined.

24. An electronic device as recited in claim 23, wherein the program or erase period includes zero program or erase period.

25. An electronic device as recited in claim 23 wherein the start, stop, read, program, or erase conditions have timing related to system clock.

26. An electronic device as recited in claim 23, wherein the electronic device providing data storage comprises:

a divider connected to the clock input and configured to receive the system clock and divide the system clock to produce a reduced frequency clock.

27. An electronic device as recited in claim 26, wherein the start, stop, read, program, or erase conditions have timing related to the reduced frequency clock.

\* \* \* \* \*